United States Patent
Hu et al.

(10) Patent No.: US 11,342,393 B2
(45) Date of Patent: May 24, 2022

(54) METHOD FOR MANUFACTURING OLED LIGHT EMITTING DEVICE, OLED LIGHT EMITTING DEVICE AND OLED DISPLAY DEVICE

(71) Applicants: HEFEI BOE JOINT TECHNOLOGY CO., LTD., Hefei (CN); BOE TECHNOLOGY GROUP CO., LTD., Beijing (CN)

(72) Inventors: Yue Hu, Beijing (CN); Chinlung Liao, Beijing (CN); Chienyu Chen, Beijing (CN)

(73) Assignees: HEFEI BOE JOINT TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 309 days.

(21) Appl. No.: 16/810,386

(22) Filed: Mar. 5, 2020

(65) Prior Publication Data
US 2021/0091150 A1    Mar. 25, 2021

(30) Foreign Application Priority Data
Sep. 25, 2019    (CN) .......................... 201910909671.2

(51) Int. Cl.
*H01L 27/32*    (2006.01)

(52) U.S. Cl.
CPC ........ *H01L 27/3246* (2013.01); *H01L 27/326* (2013.01); *H01L 2227/323* (2013.01)

(58) Field of Classification Search
CPC .......................... H01L 27/3246; H01L 27/326
See application file for complete search history.

(56) References Cited

U.S. PATENT DOCUMENTS

| 8,421,348 B2 | 4/2013 | Kim et al. |
| 11,127,798 B2 * | 9/2021 | Wang ..................... H01L 51/56 |
| 2003/0222267 A1 | 12/2003 | Kim et al. |

(Continued)

FOREIGN PATENT DOCUMENTS

| CN | 101207150 A | 6/2008 |
| CN | 110071143 A | 7/2019 |

OTHER PUBLICATIONS

First Chinese Office Action dated Jun. 30, 2021, received for corresponding Chinese patent application No. 201910909671.2, 20 pages.

*Primary Examiner* — Douglas M Menz
(74) *Attorney, Agent, or Firm* — Kinney & Lange, P.A.

(57) ABSTRACT

The present disclosure relates to a method for manufacturing an OLED light emitting device, an OLED light emitting device, and an OLED display device. The method for manufacturing an OLED light emitting device according to an embodiment of the present disclosure includes forming a pixel defining layer on a substrate, wherein the pixel defining layer comprises a lyophilic material or a lyophobic material and the pixel defining layer comprises a plurality of openings which are spaced apart from each other; forming an anode layer on the substrate and in each opening; adding a preset solvent having a property opposite to that of the lyophilic material or the lyophobic material of the pixel defining layer in an OLED film layer ink; and ink-jet printing the OLED film layer ink on the anode layer and in each opening to form an OLED film layer.

17 Claims, 3 Drawing Sheets

(56) References Cited

U.S. PATENT DOCUMENTS

| | | |
|---|---|---|
| 2003/0230967 A1 | 12/2003 | Kawamura et al. |
| 2008/0150423 A1 | 6/2008 | Kim et al. |
| 2017/0279049 A1* | 9/2017 | Dai ........................ H01L 51/56 |
| 2018/0286934 A1* | 10/2018 | Zhao ................... H01L 51/0005 |
| 2018/0327622 A1* | 11/2018 | Pan ....................... C09D 11/36 |
| 2019/0229161 A1* | 7/2019 | Hou ....................... H01L 51/56 |
| 2019/0296239 A1* | 9/2019 | Jia ......................... H01L 51/56 |
| 2021/0343804 A1* | 11/2021 | Hsu ..................... H01L 27/3246 |

* cited by examiner

METHOD FOR MANUFACTURING OLED LIGHT EMITTING DEVICE, OLED LIGHT EMITTING DEVICE AND OLED DISPLAY DEVICE

CROSS-REFERENCE TO RELATED APPLICATION

The present application claims the benefit of Chinese Patent Application No. 201910909671.2 filed on Sep. 25, 2019 in the National Intellectual Property Administration of China, the whole disclosure of which is incorporated herein by reference.

TECHNICAL FIELD

The present disclosure relates to a field of display technology and in particular to a method for manufacturing an OLED light emitting device, an OLED light emitting device and an OLED display device.

BACKGROUND

At present, each functional layer in an OLED (Organic Light-Emitting Diode) device, such as a hole transport layer, an organic light-emitting layer, and an electron-transporting layer, is usually formed with a specific pattern using ink-jet printing technology, but during the ink-jet printing process, due to a lyophilic or lyophobic property of the material of the pixel defining layer, it will be difficult to form an organic film layer of uniform thickness in a sub-pixel region with organic solutions, and an organic film layer of uneven thickness will adversely affect uniformity of brightness of a light emission. Therefore, in the case of ink-jet printing, how to improve the uniformity of the thickness of the organic film layer has become an urgent problem.

SUMMARY

According to an aspect of the present disclosure, there is provided a method for manufacturing an OLED light-emitting device, comprising:
  forming a pixel defining layer on a substrate, wherein the pixel defining layer comprises a lyophilic material or a lyophobic material and the pixel defining layer comprises a plurality of openings which are spaced apart from each other;
  forming an anode layer on the substrate and in each opening;
  adding a preset solvent having a property opposite to that of the lyophilic material or the lyophobic material of the pixel defining layer in an OLED film layer ink; and
  ink-jet printing the OLED film layer ink on the anode layer and in each opening to form an OLED film layer.

In some embodiments, the step of adding a preset solvent having a property opposite to that of the lyophilic material or the lyophobic material of the pixel defining layer in an OLED film layer ink comprises:
  adding a first preset solvent having a property opposite to that of the lyophilic material or the lyophobic material of the pixel defining layer into light-emitting layer ink; and/or
  adding a second preset solvent having a property opposite to that of the lyophilic material or the lyophobic material of the pixel defining layer into a hole transport layer ink; and/or
  adding a third preset solvent having a property opposite to that of the lyophilic material or the lyophobic material of the pixel defining layer into a hole injection layer ink.

In some embodiments, the step of ink-jet printing the OLED film layer ink on the anode layer and in each opening to form an OLED film layer comprises:
  forming a hole injection layer on the anode layer and in each opening;
  forming a hole transport layer on the hole injection layer and in each opening;
  ink-jet printing the light-emitting layer ink on the hole transport layer and in each opening to form a light-emitting layer.

In some embodiments, the step of forming a hole transport layer on the hole injection layer and in each opening comprises:
  ink-jet printing the hole transport layer ink on the hole injection layer and in each opening to form the hole transport layer.

In some embodiments, the step of forming a hole injection layer on the anode layer and in each opening comprises:
  ink-jet printing the hole injection layer ink on the anode layer and in each opening to form the hole injection layer.

In some embodiments, the pixel defining layer comprises the lyophilic material, and a solvent ratio of the first preset solvent is greater than a solvent ratio of the second preset solvent, and the solvent ratio of the second preset solvent is greater than a solvent ratio of the third preset solvent.

In some embodiments, the pixel defining layer comprises the lyophobic material, and a solvent ratio of the first preset solvent is smaller than the solvent ratio of the second preset solvent, and the solvent ratio of the second preset solvent is smaller than a solvent ratio of the third preset solvent.

In some embodiments, a lyophobic solvent comprises a fluorine-containing organic solvent; and a lyophilic solvent comprises a benzene-containing organic solvent or an alcoholic organic solvent.

According to another aspect of the present disclosure, there is provided an OLED light-emitting device, which is prepared by the method for manufacturing an OLED light-emitting device mentioned above, comprising:
  a substrate;
  a pixel defining layer on the substrate, wherein the pixel defining layer comprises a lyophilic material or a lyophobic material, and the pixel defining layer comprises a plurality of openings which are spaced apart from each other;
  an anode layer which is arranged on the substrate and in each opening;
  an OLED film layer formed by ink-jet printing an OLED film layer ink on the anode layer and in each opening, the OLED film layer ink comprising a preset solvent having a property opposite to that of the lyophilic material or the lyophobic material of the pixel defining layer.

In some embodiments, the OLED film layer ink comprises a light-emitting layer ink, the preset solvent comprises a first preset solvent having a property opposite to that of the lyophilic material or the lyophobic material of the pixel defining layer, and the light-emitting layer ink comprises the first preset solvent; and/or
  the OLED film layer ink comprises a hole transport layer ink, the preset solvent comprises a second preset solvent having a property opposite to that of the lyophilic material or the lyophobic material of the pixel defining layer, and the hole transport layer ink comprises the second preset solvent; and/or the OLED film layer ink comprises a hole injection layer ink, the preset solvent comprises a third preset solvent having a property opposite to that of the lyophilic material or the lyophobic material of the pixel defining layer, and the hole injection layer ink comprises the third preset solvent.

In some embodiments, the OLED film layer comprises:

a hole injection layer arranged on the anode layer and in each opening;

a hole transport layer arranged on the hole injection layer and in each opening;

a light-emitting layer formed by ink-jet printing the light-emitting layer ink on the hole transport layer and in each opening.

In some embodiments, the hole transport layer is formed by ink-jet printing the hole transport layer ink on the hole injection layer and in each opening.

In some embodiments, the hole injection layer is formed by ink-jet printing the hole injection layer ink on the anode layer and in each opening.

In some embodiments, the pixel defining layer comprises a lyophilic material, and a solvent ratio of the first preset solvent is greater than a solvent ratio of the second preset solvent, and the solvent ratio of the second preset solvent is greater than a solvent ratio of the third preset solvent.

In some embodiments, the pixel defining layer comprises a lyophobic material, and a solvent ratio of the first preset solvent is smaller than a solvent ratio of the second preset solvent, and the solvent ratio of the second preset solvent is smaller than a solvent ratio of the third preset solvent.

In some embodiments, a lyophobic solvent comprises a fluorine-containing organic solvent;

a lyophilic solvent comprises a benzene-containing organic solvent or an alcoholic organic solvent.

According to another aspect of the present disclosure, there is provided an OLED display device, comprising the OLED light-emitting device mentioned above.

DETAILED DESCRIPTION OF EMBODIMENTS

In order to further explain the technical means and effects adopted by the present disclosure to achieve the intended purpose of the present disclosure, the following describes the method for manufacturing the OLED light-emitting device, the OLED light-emitting device, and the OLED display device according to the present disclosure with reference to the drawings and preferred embodiments. The detailed description of the specific embodiments, structures, features and effects thereof will be described as follows.

Figure 4:
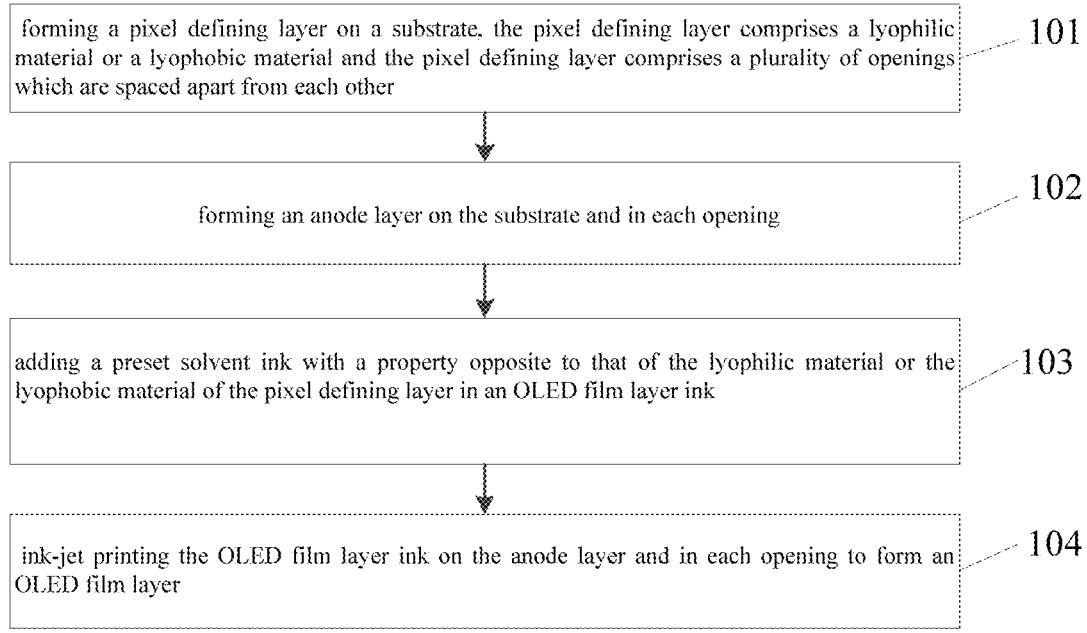
FIG. 4 is a flowchart of a method for manufacturing an OLED display device according to an embodiment of the present disclosure.

As shown in FIG. 4, an embodiment of the present disclosure provides a method for manufacturing an OLED light emitting device, including:

S101: forming a pixel defining layer on a substrate, the pixel defining layer comprises a lyophilic material or a lyophobic material and the pixel defining layer comprises a plurality of openings which are spaced apart from each other;

Before forming the pixel defining layer on the substrate, the substrate is provided; the pixel defining layer is provided on the substrate. The area formed by each of the plurality of openings is a sub-pixel region, and the pixel defining layer is divided into two types: lyophilic and lyophobic. The material property of the pixel defining layer will affect the film layer formed in the sub-pixel region. In the related art, when the pixel defining layer is lyophilic, the material of the pixel defining layer is a lyophilic material. It tends to form an organic film layer with a thick edge region and a thin central region in the sub-pixel region. When the pixel defining layer is lyophobic, the material of the pixel defining layer is a lyophobic material. It tends to form an organic film layer with a thin edge region and a thick central region in the sub-pixel region. In these two cases, the luminous brightness is not uniform.

S102: forming an anode layer on the substrate and in each opening;

An anode layer is formed on the substrate and in each opening, that is, the anode layer is formed in the sub-pixel region, and the anode layer is disposed on the substrate in the sub-pixel region by a sputtering process.

S103: adding a preset solvent ink with a property opposite to that of the lyophilic material or the lyophobic material of the pixel defining layer in an OLED film layer ink;

In the condition of heating and stirring, a preset solvent with a property opposite to that of the lyophilic material or the lyophobic material of the pixel defining layer is added into the OLED film layer ink. At this time, the OLED film layer ink includes the preset solvent and the original OLED film layer ink, the ratio of the solute to the solution in the original OLED film layer ink needs to be adjusted according to the preset solvent. After adding the preset solvent, the ratio of the solute to the solution in the OLED film layer ink is the same as the ratio of the solute to the solution in the original OLED film layer ink, so that the process of ink-jet printing the light emitting layer can be completed. When the pixel defining layer includes a lyophilic material, the preset solvent added into the OLED film layer ink is a lyophobic solvent; when the pixel defining layer includes a lyophobic material, the preset solvent added into the OLED film layer ink is a lyophilic solvent.

S104: ink-jet printing the OLED film layer ink on the anode layer and in each opening to form an OLED film layer.

The OLED film layer ink cooled to room temperature is ink-jet printed on the anode layer and subsequent drying process is performed to form an OLED film layer. At this time, the property of the OLED film layer material are opposite to that of the pixel defining layer, which can reduce interaction between the edge of the light-emitting layer film layer and the pixel defining layer, thereby making the edge climbing degree of the light-emitting layer lower than that of the light-emitting layer in the related art.

The method for manufacturing an OLED light-emitting device according to an embodiment of the present disclosure includes forming a pixel defining layer on the substrate. The pixel defining layer includes a lyophilic material or a lyophobic material. The pixel defining layer includes a plurality of openings which are arranged to be spaced apart from each other. The anode layer is formed on the substrate and in each opening. In the related art, since the pixel defining layer includes a lyophilic material or a lyophobic material, the OLED film layer formed by ink-jet printing on the anode layer will interact with the lyophilic material or the lyophobic material and the edge of the layer will climb up or down, thereby causing the thickness thereof to be uneven, and the method for manufacturing the OLED light-emitting device provided in the present disclosure includes adding a preset solvent ink with a property opposite to that of the lyophilic material or the lyophobic material of the pixel defining layer in an OLED film layer ink; and then ink-jet printing the OLED film layer ink on the anode layer and in each opening to form an OLED film layer. At this time, the formed OLED film layer has a material with a property opposite to that of the lyophilic material or the lyophobic material of the pixel defining layer, that is, when the pixel defining layer is of a lyophilic material, a preset solvent added into the OLED film layer ink is a lyophobic solvent. When the pixel defining layer is of a lyophobic material, the preset solvent added into the OLED film layer ink is a lyophilic solvent. It can reduce the interaction between the edge of the film layer and the pixel defining layer, thereby reducing climbing effect of the edge of the OLED film layer on the pixel defining layer and making the thickness of the entire film layer more uniform, and thereby improving the uniformity of light emission of the OLED light emitting device.

Figure 5:
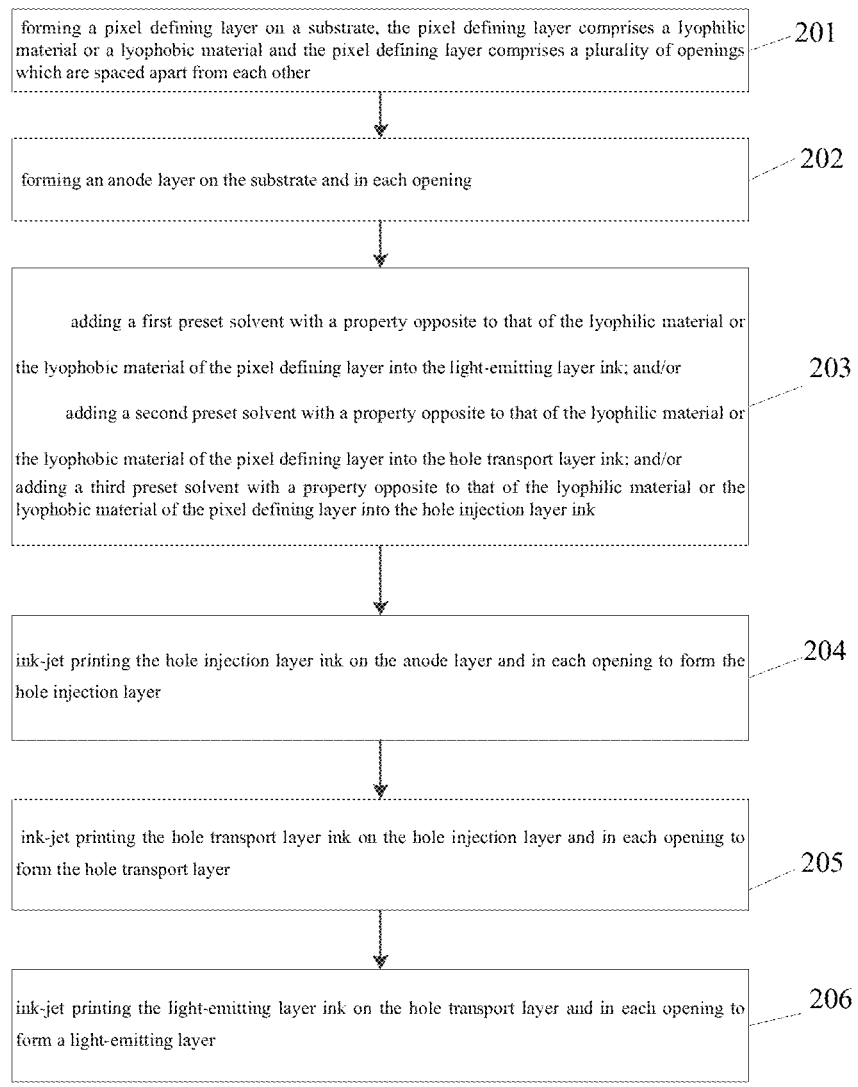
FIG. 5 is a flowchart of another method for manufacturing an OLED display device according to an embodiment of the present disclosure.

As shown in FIG. 5, the present application provides a method for manufacturing an OLED light-emitting device, including:

S201: forming a pixel defining layer on a substrate, the pixel defining layer comprises a lyophilic material or a lyophobic material and the pixel defining layer comprises a plurality of openings which are spaced apart from each other;

The pixel defining layer is formed on the substrate, and each opening of the pixel defining layer and the substrate form a sub-pixel region.

S202: forming an anode layer on the substrate and in each opening;

The anode layer is disposed on the substrate in the sub-pixel region by a sputtering process.

S203: adding a first preset solvent with a property opposite to that of the lyophilic material or the lyophobic material of the pixel defining layer into a light-emitting layer ink; and/or adding a second preset solvent with a property opposite to that of the lyophilic material or the lyophobic material of the pixel defining layer into a hole transport layer ink; and/or adding a third preset solvent with a property opposite to that of the lyophilic material or the lyophobic material of the pixel defining layer into a hole injection layer ink.

The OLED film layer ink includes a light-emitting layer ink, a hole transport layer ink, and a hole injection layer ink. When the OLED film layer ink is a light-emitting layer ink, the preset solvent comprises a first preset solvent, and the light-emitting layer ink comprises a first preset solvent with a property opposite to that of the lyophilic material or the lyophobic material of the pixel defining layer into the light-emitting layer ink; and/or when the OLED film layer ink is a hole transport layer ink, the preset solvent comprises a second preset solvent, and the hole transport layer ink comprises a second preset solvent with a property opposite to that of the lyophilic material or the lyophobic material of the pixel defining layer; and/or when the OLED film layer ink is a hole injection layer ink, the preset solvent comprises a third preset solvent, and the hole injection layer ink comprises a third preset solvent with a property opposite to that of the lyophilic material or the lyophobic material of the pixel defining layer.

S204: ink-jet printing the hole injection layer ink on the anode layer and in each opening to form the hole injection layer;

The hole injection layer ink is added with a third preset solvent according to the property of the lyophilic material or the lyophobic material of the material of the pixel defining layer under the condition of heating and stirring, and the ratio of the solute to the solution in the hole injection layer ink added with the third preset solvent needs to be determined according to the third preset solvent. The materials of solvent and solute in the hole injection layer ink added with the third preset solvent are the same as those in the original hole injection layer ink, so that the hole injection layer can be completed. When the pixel defining layer is of a lyophilic material, the third preset solvent added into the hole-injecting layer ink is a lyophobic solvent. When the pixel defining layer is of a lyophobic material, the third preset solvent added into the hole-injecting layer ink is a lyophilic solvent.

The hole injection layer ink cooled to room temperature is ink-jet printed on the anode layer of the sub-pixel region, and a subsequent drying process is performed to form a hole injection layer. At this time, the material of the hole injection layer includes a material having a property opposite to that of lyophilic material or lyophobic material of the pixel defining layer, which can reduce the interaction between the edge of the hole injection layer and the pixel defining layer, so that the edge climbing degree of the hole injection layer is lower than that of the hole injection layer in the related art.

S205: ink-jet printing the hole transport layer ink on the hole injection layer and in each opening to form the hole transport layer;

the hole transport layer ink is added with a second preset solvent according to the property of the lyophilic material or the lyophobic material of the material of the pixel defining layer under the condition of heating and stirring, and the ratio of the solute to the solution in the hole transport layer ink added with the second preset solvent needs to be determined according to the second preset solvent. The materials of the solvent and the solute in the hole transport layer ink added with the second preset solvent are the same as those in the original hole transport layer ink, so that ink-jet printing the hole transport layer can be completed. When the pixel defining layer is of a lyophilic material, the second preset solvent added into the hole transport layer ink is a lyophobic solvent. When the pixel defining layer is of a lyophobic material, the second preset solvent added into the hole transport layer ink is a lyophilic solvent.

The hole transport layer ink cooled to room temperature is ink-jet printed on the hole injection layer in the sub-pixel region, and a subsequent drying process is performed to form a hole transport layer. At this time, the hole transport layer includes a material having a property opposite to that of lyophilic material or lyophobic material of the pixel defining layer, which can reduce the interaction between the edge of the hole transport layer and the pixel defining layer, so that the edge climbing degree of the hole transport layer is lower than that of the hole transport layer in the related art.

S206: ink-jet printing the light-emitting layer ink on the hole transport layer and in each opening to form a light-emitting layer.

The light-emitting layer ink is added with a first preset solvent according to the property of the lyophilic material or the lyophobic material of the material of the pixel defining layer under the condition of heating and stirring. The ratio of the solute to the solution in the light-emitting layer ink added with the first preset solvent needs to be determined according to the first preset solvent, the materials of the solvent and the solute in the light-emitting layer ink added with the first preset solvent are the same as those in the original light-emitting layer ink, so that ink-jet printing the light-emitting layer can be completed. When the pixel defining layer is of a lyophilic material, the first preset solvent added into the light-emitting layer ink is a lyophobic solvent. When the pixel defining layer is of a lyophobic material, the first preset solvent is a lyophilic solvent.

The light-emitting layer ink cooled to room temperature is ink-jet printed on the hole transport layer in the sub-pixel region, and a subsequent drying process is performed to form a light-emitting layer. At this time, the light-emitting layer includes a material having a property opposite to that of lyophilic material or lyophobic material of the pixel defining layer, which can reduce the interaction between the edges of the light-emitting layer and the pixel defining layer, so that the edges climbing degree of the light-emitting layer is lower than that of the light-emitting layer in the related art.

As for the method for manufacturing an OLED light-emitting device according to an embodiment of the present disclosure, in the process of manufacturing an OLED light-emitting device, the OLED film layer ink includes a light-emitting layer ink and/or a hole transport layer ink and/or a hole injection layer ink. The hole injection layer ink, the hole transport layer ink, and the light-emitting layer ink are all added with preset solvents having a property opposite to that of the lyophilic material or the lyophobic material of the pixel defining layer, and then the ink-jet printing is performed in order to form the hole injection layer, the hole transport layer and the light-emitting layer, at this time, the hole-injecting layer, the hole transport layer, and the light-emitting layer all have preset solvents having a property opposite to that of the lyophilic material or the lyophobic material of the pixel defining layer, thereby interaction with the pixel defining layer being reduced, and the surfaces of the hole injection layer, the hole transport layer, and the light-emitting layer will be flatter, which can further improve the flatness of the OLED film layer and the uniformity of light emission of the OLED light-emitting device.

In this embodiment, the lyophobic solvent is a fluorine-containing organic solvent, the lyophilic solvent is a benzene-containing organic solvent or an alcoholic organic solvent, and the benzene-containing organic solvent or alcoholic organic solvent is contained in a first ink, so that the composition of the OLED film layer ink can be performed only by adjusting the proportion of the benzene-containing organic solvent or the alcoholic organic solvent in the first ink.

Optionally, when the pixel defining layer is lyophilic, each opening of the pixel defining layer which are spaced apart from each other form a sub-pixel region, and the original hole injection layer ink is printed on the anode layer in the sub-pixel region by ink-jet printing, and forms the hole injection layer after being baked. Due to the interaction between the original hole injection layer ink and the pixel defining layer, the edge of the hole injection layer will climb on the pixel defining layer; then under heating and stirring conditions, a fluorine-containing organic solvent is added into the hole transport layer ink, such as difluorochloromethane and/or 1,1,2-trifluorotrichloroethane and/or tetrafluoroethylene and/or trifluorochloroethylene and/or the like. The solvent ratio is adjusted between 0.5% and 3% to form a hole transport layer ink. After the hole transport layer ink is cooled to room temperature, the ink-jet printing is performed, and then a subsequent drying process is performed to form a hole transport layer. Since the fluorine-containing organic solvent is added to the hole transport layer, the interaction between the hole transport layer and the pixel defining layer is reduced, and the surface of the hole transport layer will be flatter. Subsequently under the condition of heating and stirring, a fluorine-containing organic solvent is added into the light-emitting layer ink, and the proportion of the fluorine-containing solvent added into the light-emitting layer ink is higher than that added into the hole transport layer ink. The formed light-emitting layer is flatter than the hole transport layer. Under the condition of heating and stirring, the fluorine-containing organic solvent added into the light-emitting layer ink may include polyfluorobenzenes and/or chlorine, bromine, iodofluorobenzenes and/or fluoronitrobenzenes and/or fluoroanilines and/or fluorophenols and/or fluorobenzaldehydes and/or fluorophenylacetones and/or fluorobenzoic acids and/or cresol chlorine and/or fluorotoluenes and other fluorobenzenes and/or monotrifluorotoluene and/or bistrifluorotoluene and/or fluoropyridine and/or trifluoromethylpyridine, etc., the solvent ratio is adjusted between 1% and 5%, and then is cooled to room temperature to perform the normal ink-jet printing and subsequent drying process, and then a light-emitting layer is formed. Since a fluorine-containing organic solvent is added into the light-emitting layer ink, the interaction between the light-emitting layer and the pixel defining layer is greatly reduced, and the surface of the light-emitting layer will be flatter. After both surfaces of the hole transport layer and the light emitting layer become flatter, the film uniformity of the entire OLED will be improved, so that light emission uniformity of the entire light emitting device OLED can be improved. In addition, only adding a fluorine-containing organic solvent into the hole transport layer and the light emitting layer can not only ensure the uniformity of the OLED film layer, but also reduce the production cost of the OLED film layer.

Figure 1:
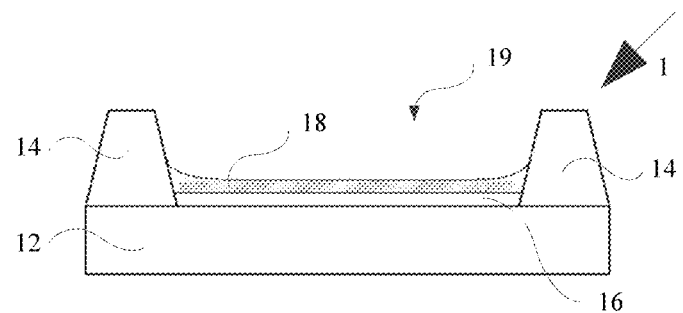
FIG. 1 is a schematic structural diagram of a part of an OLED light emitting device according to an embodiment of the present disclosure, in which a hole injection layer is shown.
Figure 2:
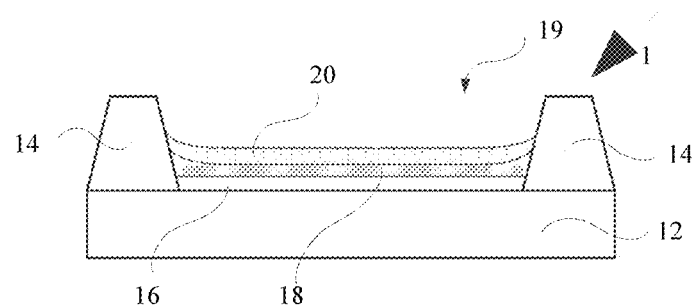
FIG. 2 is a schematic structural diagram of a part of an OLED light emitting device according to an embodiment of the present disclosure, in which a hole injection layer and a hole transport layer are shown.
Figure 3:
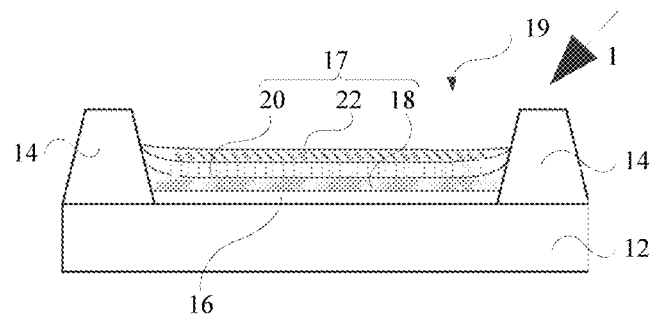
FIG. 3 is a schematic structural diagram of a part of an OLED light emitting device according to an embodiment of the present disclosure, in which a hole injection layer, a hole transport layer and a light emitting layer are shown.

As shown in FIG. 1 to FIG. 3, in another aspect, the present disclosure further provides an OLED light emitting device 1, which is manufacturing by the method for manufacturing an OLED light emitting device 1 described above, including:
- a substrate 12;
- a pixel defining layer 14 that is disposed on the substrate 12, the pixel defining layer 14 including a lyophilic material or a lyophobic material, and the pixel defining layer 14 including a plurality of openings 19 which are spaced apart from each other;
- an anode layer 16, which is located on the substrate 12 and is located in each opening 19;
- an OLED film layer 17 is formed on the anode layer 16 and in each opening 19 by ink-jet printing the OLED film layer ink. The OLED film layer ink includes a preset solvent having a property opposite to that of the lyophilic material or the lyophobic material of the pixel defining layer 14.

The OLED light emitting device 1 according to an embodiment of the present disclosure includes a substrate 12, a pixel defining layer 14, an anode layer 16, and an OLED film layer 17. Each opening 19 of the pixel defining layer 14 and the substrate 12 form a sub-pixel region. The anode layer 16 and the OLED film layer 17 are both disposed in the sub-pixel region. The pixel defining layer 14 have a lyophilic or lyophobic property. The material property of the pixel defining layer 14 will affect the film layers formed in the sub-pixel region. In the related art, when the pixel defining layer 14 is lyophilic and the material of the pixel defining layer 14 is a lyophilic material, it tends to form an OLED film layer 17 with a thick edge region and a thin central region in the sub-pixel region. When the pixel defining layer 14 is lyophilic and the material of the pixel defining layer 14 is a lyophobic material, it tends to form an OLED with a thin edge region and a thick central region in the sub-pixel. These two situations may cause uneven luminance of the sub-pixels.

Therefore, in the OLED light-emitting device 1 provided in the present disclosure, the OLED film layer 17 is ink-jet printed on the anode layer 16 with the OLED film layer ink, and the OLED film layer ink includes a preset solvent with a property opposite to that of the lyophilic material or the lyophobic material of the pixel defining layer 14. When the pixel defining layer 14 is of a lyophilic material, the OLED film layer ink includes a lyophobic solvent. When the pixel defining layer 14 is of a lyophobic material, the OLED film layer ink includes a lyophilic solvent. As a result, the interaction between the OLED film layer 17 formed by ink-jet printing the OLED film layer and the pixel defining layer 14 is reduced, so that the edge climbing degree of the OLED film layer 17 is lower than that of the OLED film layer 17 in the related art. Furthermore, the overall thickness of the OLED film layer 17 is more uniform, thereby improving the uniformity of light emission of the OLED light emitting device 11.

In the embodiment of the present disclosure, the OLED film layer ink is a light-emitting layer ink, the preset solvent is a first preset solvent, and the light-emitting layer ink includes a first preset solvent with a property opposite to that of the lyophilic material or the lyophobic material of the pixel defining layer; and/or The OLED film layer ink is a hole transport layer ink, the preset solvent is a second preset solvent, and the hole transport layer ink includes the second preset solvent with a property opposite to that of the lyophilic material or the lyophobic material of the pixel defining layer; and/or The OLED film layer ink is a hole injection layer ink, the preset solvent is a third preset solvent, and the hole injection layer ink includes a third preset solvent with a property opposite to that of the lyophilic material or the lyophobic material of the pixel defining layer.

In this embodiment, the light-emitting layer ink is added with a first preset solvent according to the property of the lyophilic material or the lyophobic material of the material of the pixel defining layer 14 under the condition of heating and stirring. The ratio of the solute to the solution in the light-emitting layer ink added with the first preset solvent needs to be determined according to the first preset solvent, the materials of the solvent and the solute in the light-emitting layer ink added with the first preset solvent are the same as those in the original light-emitting layer ink, so that ink-jet printing the light-emitting layer 22 can be completed. When the pixel defining layer 14 is of a lyophilic material, the first preset solvent added into the light-emitting layer ink is a lyophobic solvent. When the pixel defining layer 14 is of a lyophobic material, the first preset solvent is a lyophilic solvent.

The hole transport layer ink is added with a second preset solvent according to the property of the lyophilic or the lyophobic of the material of the pixel defining layer 14 under the condition of heating and stirring, and the ratio of the solute to the solution in the hole transport layer ink added with the second preset solvent needs to be determined according to the second preset solvent. The materials of the solvent and the solute in the hole transport layer ink added with the second preset solvent are the same as those in the original hole transport layer ink, so that ink-jet printing the hole transport layer 20 can be completed. When the pixel defining layer 14 is of a lyophilic material, the second preset solvent added into the hole transport layer ink is a lyophobic solvent. When the pixel defining layer 14 is of a lyophobic material, the second preset solvent added into the hole transport layer ink is a lyophilic solvent.

The hole injection layer ink is added with a third preset solvent according to the property of the lyophilic material or the lyophobic material of the material of the pixel defining layer 14 under the condition of heating and stirring, and the ratio of the solute to the solution in the hole injection layer ink added with the third preset solvent needs to be determined according to the third preset solvent. The materials of solvent and solute in the hole injection layer ink added with the third preset solvent are the same as those in original hole injection layer ink, so that the hole injection layer 18 can be completed. When the pixel defining layer 14 is of a lyophilic material, the third preset solvent added into the hole-injecting layer ink is a lyophobic solvent. When the pixel defining layer 14 is of a lyophobic material, the third preset solvent added into the hole-injecting layer ink is a lyophilic solvent.

In the embodiment of the present disclosure, the OLED film layer 17 includes:
  a hole injection layer 18, which is located on the anode layer 16 and is located in each opening 19;
  a hole transport layer 20, which is located on the hole injection layer 18 and is located in each opening 19;
  a light-emitting layer 22, which is formed on the hole transport layer 20 by ink-jet printing the light-emitting layer ink, and is located in each opening 19.

In this embodiment, the light-emitting layer 22 is formed by ink-jet printing the light-emitting layer ink on the hole transport layer 20, and the light-emitting layer ink cooled to room temperature is ink-jet printed on the hole transport layer 20 in the sub-pixel region, and a subsequent drying process is performed to form a light-emitting layer 22. At this time, the light-emitting layer 22 includes a material having a property opposite to that of lyophilic material or lyophobic material of the pixel defining layer 14, which can reduce the interaction between the edges of the light-emitting layer 22 and the pixel defining layer 14 after the light-emitting layer 22 is formed, so that the edges climbing degree of the light-emitting layer 22 is lower than that of the light-emitting layer in the related art and the surfaces of the light-emitting layer 22 will be flatter, which can improve the flatness of the OLED film layer 17 and the uniformity of light emission of the OLED light-emitting device 1.

In the embodiment of the present disclosure, the hole transport layer 20 is formed on the hole-injecting layer 18 by ink-jet printing the hole transport layer ink, and is located in each opening 19.

In this embodiment, the hole transport layer 20 is formed on the hole injection layer 18 by ink-jet printing the hole transport layer ink. The hole transport layer ink cooled to room temperature is ink-jet printed on the hole injection layer 18 in the sub-pixel region, and a subsequent drying process is performed to form a hole transport layer 20. At this time, the hole transport layer 20 includes a material having a property opposite to that of lyophilic material or lyophobic material of the pixel defining layer 14, which can reduce the interaction between the edge of the hole transport layer 20 and the pixel defining layer 14, so that the edge climbing degree of the hole transport layer 20 is lower than that of the hole transport layer 20 in the related art and the surfaces of the hole transport layer 20 will be flatter, which can improve the flatness of the hole transport layer 20 and the uniformity of light emission of the OLED light-emitting device 1.

In the embodiment of the present disclosure, the hole injection layer 18 is formed on the anode layer 16 by ink-jet printing of the hole injection layer ink, and is located in each opening 19.

In this embodiment, the hole injection layer 18 is formed on the anode layer 16 by ink-jet printing the hole injection layer ink, and the hole injection layer ink cooled to room temperature is ink-jet printed on the anode layer 16 of the sub-pixel region, and a subsequent drying process is performed to form a hole injection layer 18. At this time, the material of the hole injection layer 18 includes a material having a property opposite to that of lyophilic material or lyophobic material of the pixel defining layer 14, which can reduce the interaction between the edge of the hole injection layer 18 and the pixel defining layer 14, so that the edge climbing degree of the hole injection layer 18 is lower than that of the hole injection layer 18 in the related art, so that the surface of the hole injection layer 18 will be flatter. Therefore, the flatness of the entire OLED film layer 17 can be further improved, and the uniformity of light emission of the OLED light emitting device 1 can be further improved.

In the embodiment of the present disclosure, the lyophobic solvent is a fluorine-containing organic solvent;

The lyophilic solvent is a benzene-containing organic solvent or an alcoholic organic solvent.

In this embodiment, the lyophobic solvent is a fluorine-containing organic solvent, the lyophilic solvent is a benzene-containing organic solvent or an alcoholic organic solvent, and the benzene-containing organic solvent or the alcoholic organic solvent is a solvent contained in the light-emitting layer ink, the hole transport layer ink or the hole injection layer ink, so that the composition of a light emitting layer ink, a hole transport layer ink, or a hole injection layer ink can be performed only by adjusting the proportion of the organic solvent containing benzene or the alcoholic organic solvent in the light-emitting layer ink or the hole transport layer ink or the hole-injecting layer ink.

In this embodiment, the materials of the solvent and the solute in the light-emitting layer ink are the same as those in the original light-emitting layer ink, but the ratio of the solute to the solution in the light-emitting layer ink needs to be determined according to the first preset solvent, and the ratio of the solute to the solution of the light-emitting layer ink added with the first preset solvent is the same as that of the original film layer ink, so that ink-jet printing the light-emitting layer 22 can be completed. The materials of the solvent and solute in the hole transport layer ink are the same as those in the original hole transport layer ink, but the ratio of the solute to the solution in the hole transport layer ink needs to be determined according to the second preset solvent, and the ratio of the solute to the solution of the hole transport layer ink added with the second preset solvent is the same as that of the original hole transport layer ink, so that ink-jet printing the hole transport layer 20 can be completed. The materials of the solvent and solute in the hole injection layer ink are the same as those in the original hole injection layer ink, but the ratio of the solute to the solution in the hole injection layer ink needs to be determined according to the third preset solvent, and the ratio of the solute to the solution of the hole injection layer ink added with the third preset solvent is the same as that of the original hole injection layer ink, so that ink-jet printing the hole injection layer 18 can be completed.

Optionally, the pixel defining layer 14 is lyophilic, each opening 14 of the pixel defining layer 14 and the base substrate 12 forms a sub-pixel region, and the original hole injection layer ink is printed in the sub-pixel region by ink-jet printing, and forms the layer after being baked. Due to the interaction between the hole injection layer ink and the pixel defining layer 14, the edge of the hole injection layer 18 will climb; then under heating and stirring conditions, a fluorine-containing organic solvent is added into the hole transport layer ink, such as difluorochloromethane and/or 1,1,2-trifluorotrichloroethane and/or tetrafluoroethylene and/or trifluorochloroethylene and/or the like. The solvent ratio is adjusted between 0.5% and 3% to form a hole transport layer ink. After the hole transport layer ink is cooled to room temperature, the ink-jet printing is performed, and then a subsequent drying process is performed to form a hole transport layer 20. Since the fluorine-containing organic solvent is added to the hole transport layer 20, the interaction between the hole transport layer and the pixel defining layer is reduced, and the surface of the hole transport layer 20 will be flatter. Subsequently under the condition of heating and stirring, a fluorine-containing organic solvent is added into the light-emitting layer ink, and the proportion of the fluorine-containing solvent added into the light-emitting layer ink is higher than that added into the hole transport layer ink. Under the condition of heating and stirring, the fluorine-containing organic solvent added into the light-emitting layer ink may include polyfluorobenzenes and/or chlorine, bromine, iodofluorobenzenes and/or fluoronitrobenzenes and/or fluoroanilines and/or fluorophenols and/or fluorobenzaldehydes and/or fluorophenylacetones and/or fluorobenzoic acids and/or cresol chlorine and/or fluorotoluenes and other fluorobenzenes and/or monotrifluorotoluene and/or bistrifluorotoluene and/or fluoropyridine and/or trifluoromethylpyridine, etc., the solvent ratio is adjusted between 1% and 5%, and then is cooled to room temperature to perform the normal ink-jet printing and subsequent drying process, and then a light-emitting layer is formed. Since a fluorine-containing organic solvent is added into the light-emitting layer ink, the interaction between the light-emitting layer 22 and the pixel defining layer 14 is greatly reduced, and the surface of the light-emitting layer 22 will be flatter. After both surfaces of the hole transport layer and the light emitting layer become flatter, the film uniformity of the entire OLED will be improved, so that light emission uniformity of the entire light emitting device OLED can be improved. In addition, only adding a fluorine-containing organic solvent into the hole transport layer 20 and the light emitting layer 22 can not only ensure the uniformity of the OLED film layer 17, but also reduce the production cost of the OLED film layer.

In another aspect, an embodiment of the present disclosure further provides an OLED display device, which includes the OLED light-emitting device as described above, and therefore includes all technical features and beneficial technical effects of the OLED light-emitting device as described above, which are not described herein again.

Embodiments of the present disclosure provide a method for manufacturing an OLED light-emitting device, an OLED light emitting device, and an OLED display device. The method for manufacturing an OLED light-emitting device includes forming a pixel defining layer on a substrate. The pixel defining layer includes a lyophilic material or a lyophobic material. The pixel defining layer includes a plurality of openings which are arranged to be spaced apart from each other. The anode layer is formed on the substrate and in each opening. In the related art, since the pixel defining layer includes a lyophilic material or a lyophobic material, the OLED film layer formed by ink-jet printing on the anode layer will interact with the lyophilic material or the lyophobic material and the edge of the layer will climb up or down, thereby causing the thickness thereof to be uneven, and the method for manufacturing the OLED light-emitting device provided in the present disclosure includes adding a preset solvent ink with a property opposite to that of the lyophilic material or the lyophobic material of the pixel defining layer in an OLED film layer ink; and then ink-jet printing the OLED film layer ink on the anode layer and in each opening to form an OLED film layer. At this time, the formed OLED film layer has a material with a property opposite to that of the lyophilic material or the lyophobic material of the pixel defining layer, that is, when the pixel defining layer is of a lyophilic material, a preset solvent added into the OLED film layer ink is a lyophobic solvent. When the pixel defining layer is of a lyophobic material, the preset solvent added into the OLED film layer ink is a lyophilic solvent. It can reduce the interaction between the edge of the film layer and the pixel defining layer, thereby reducing climbing effect of the edge of the OLED film layer on the pixel defining layer and making the thickness of the entire film layer more uniform, and thereby improving the uniformity of light emission of the OLED light emitting device.

The above are only specific embodiments of the present disclosure, but the protection scope of the present disclosure is not limited to this. Those skilled in the art may readily conceive modifications or replacements within the technical scope disclosed in the present disclosure, which should be within the scope of this disclosure. Therefore, the protection scope of the present disclosure shall be subject to the protection scope of the claims.

What is claimed is:

1. A method for manufacturing an OLED light-emitting device, comprising:
    forming a pixel defining layer on a substrate, wherein the pixel defining layer comprises a lyophilic material or a lyophobic material and the pixel defining layer comprises a plurality of openings which are spaced apart from each other;
    forming an anode layer on the substrate and in each opening;
    adding a preset solvent having a property opposite to that of the lyophilic material or the lyophobic material of the pixel defining layer in an OLED film layer ink; and
    ink-jet printing the OLED film layer ink on the anode layer and in each opening to form an OLED film layer.

2. The method for manufacturing an OLED display device according to claim 1, wherein the step of adding a preset solvent having a property opposite to that of the lyophilic material or the lyophobic material of the pixel defining layer in an OLED film layer ink comprises:
    adding a first preset solvent having a property opposite to that of the lyophilic material or the lyophobic material of the pixel defining layer into a light-emitting layer ink; and/or
    adding a second preset solvent having a property opposite to that of the lyophilic material or the lyophobic material of the pixel defining layer into a hole transport layer ink; and/or
    adding a third preset solvent having a property opposite to that of the lyophilic material or the lyophobic material of the pixel defining layer into a hole injection layer ink.

3. The method for manufacturing an OLED display device according to claim 2, wherein the step of ink-jet printing the OLED film layer ink on the anode layer and in each opening to form an OLED film layer comprises:
    forming a hole injection layer on the anode layer and in each opening;
    forming a hole transport layer on the hole injection layer and in each opening; and
    ink-jet printing the light-emitting layer ink on the hole transport layer and in each opening to form a light-emitting layer.

4. The method for manufacturing an OLED display device according to claim 3, wherein the step of forming a hole transport layer on the hole injection layer and in each opening comprises:
    ink-jet printing the hole transport layer ink on the hole injection layer and in each opening to form the hole transport layer.

5. The method for manufacturing an OLED display device according to claim 3, wherein the step of forming a hole injection layer on the anode layer and in each opening comprises:
    ink-jet printing the hole injection layer ink on the anode layer and in each opening to form the hole injection layer.

6. The method for manufacturing an OLED display device according to claim 2, wherein the pixel defining layer comprises the lyophilic material, and a solvent ratio of the first preset solvent is greater than a solvent ratio of the second preset solvent, and the solvent ratio of the second preset solvent is greater than a solvent ratio of the third preset solvent.

7. The method for manufacturing an OLED display device according to claim 2, wherein the pixel defining layer comprises the lyophobic material, and a solvent ratio of the first preset solvent is smaller than the solvent ratio of the second preset solvent, and the solvent ratio of the second preset solvent is smaller than a solvent ratio of the third preset solvent.

8. The method for manufacturing an OLED display device according to claim 1, wherein the preset solvent comprises a lyophobic solvent comprising a fluorine-containing organic solvent, or the preset solvent comprises a lyophilic solvent comprising a benzene-containing organic solvent or an alcoholic organic solvent.

9. An OLED light-emitting device, which is prepared by the method for manufacturing an OLED light-emitting device according to claim 1, comprising:
    a substrate;
    a pixel defining layer on the substrate, wherein the pixel defining layer comprises a lyophilic material or a lyophobic material, and the pixel defining layer comprises a plurality of openings which are spaced apart from each other;

an anode layer which is arranged on the substrate and in each opening; and an OLED film layer formed by ink-jet printing an OLED film layer ink on the anode layer and in each opening, the OLED film layer ink comprising a preset solvent having a property opposite to that of the lyophilic material or the lyophobic material of the pixel defining layer.

10. The OLED light emitting device according to claim 9, wherein:

the OLED film layer ink comprises a light-emitting layer ink, the preset solvent comprises a first preset solvent having a property opposite to that of the lyophilic material or the lyophobic material of the pixel defining layer, and the light-emitting layer ink comprises the first preset solvent; and/or the OLED film layer ink comprises a hole transport layer ink, the preset solvent comprises a second preset solvent having a property opposite to that of the lyophilic material or the lyophobic material of the pixel defining layer, and the hole transport layer ink comprises the second preset solvent; and/or the OLED film layer ink comprises a hole injection layer ink, the preset solvent comprises a third preset solvent having a property opposite to that of the lyophilic material or the lyophobic material of the pixel defining layer, and the hole injection layer ink comprises the third preset solvent.

11. The OLED light emitting device according to claim 10, wherein the OLED film layer comprises:

a hole injection layer arranged on the anode layer and in each opening;

a hole transport layer arranged on the hole injection layer and in each opening; and a light-emitting layer formed by ink-jet printing the light-emitting layer ink on the hole transport layer and in each opening.

12. The OLED light emitting device according to claim 11, wherein:

the hole transport layer is formed by ink-jet printing the hole transport layer ink on the hole injection layer and in each opening.

13. The OLED light emitting device according to claim 12, wherein:

the hole injection layer is formed by ink-jet printing the hole injection layer ink on the anode layer and in each opening.

14. The OLED light-emitting device according to claim 10, wherein the pixel defining layer comprises a lyophilic material, and a solvent ratio of the first preset solvent is greater than a solvent ratio of the second preset solvent, and the solvent ratio of the second preset solvent is greater than a solvent ratio of the third preset solvent.

15. The OLED light-emitting device according to claim 10, wherein the pixel defining layer comprises a lyophobic material, and a solvent ratio of the first preset solvent is smaller than a solvent ratio of the second preset solvent, and the solvent ratio of the second preset solvent is smaller than a solvent ratio of the third preset solvent.

16. The OLED light emitting device according to claim 9, wherein:

the preset solvent comprises a lyophobic solvent comprising a fluorine-containing organic solvent; or the preset solvent comprises a lyophilic solvent comprising a benzene-containing organic solvent or an alcoholic organic solvent.

17. An OLED display device, comprising the OLED light-emitting device according to claim 9.

* * * * *